United States Patent [19]

Todd

[11] Patent Number: 5,033,665
[45] Date of Patent: Jul. 23, 1991

[54] SOLDERING SYSTEM AND METHOD OF USING SAME

[75] Inventor: Thomas Todd, San Diego, Calif.

[73] Assignee: Toddco General, San Diego, Calif.

[21] Appl. No.: 484,382

[22] Filed: Feb. 23, 1990

[51] Int. Cl.$^5$ .......................... B23K 37/04; B23K 3/00
[52] U.S. Cl. .................................... 228/103; 228/105; 228/6.2; 228/49.1
[58] Field of Search ...................... 228/103, 105, 180.2, 228/6.2, 49.1

[56] References Cited

U.S. PATENT DOCUMENTS 4,737,845  4/1988  Susuki et al. .......................... 228/105
4,832,250  5/1989  Spigarelli et al. .................... 228/119

FOREIGN PATENT DOCUMENTS 128980  11/1978  Japan .................................... 228/105
20345   1/1986   Japan .................................... 228/105

OTHER PUBLICATIONS

Surface Mount Technology, "How to Use Integral Vision and Reflow for Placement of Fine Pitch SMCs", pp. 31, 32, Feb. 1987.
IBM Technical Disclosure Bulletin "Assembly Technique for Placing Electronic Components...", vol. 31, No. 10, pp. 222-228, Mar. 1989.

Primary Examiner—Samuel M. Heinrich
Attorney, Agent, or Firm—Bernard L. Kleinke; William P. Waters; Jerry R. Potts

[57] ABSTRACT

A soldering system includes a visualization station disposed in relatively close proximity to the final resting position of a circuit element to be soldered, and a back lighted head arrangement for helping transport the circuit element to the visualization station, and for helping facilitate the clear visualization of the element so that its position may be adjusted for possible misalignment at the time of its placement at the final position.

10 Claims, 2 Drawing Sheets

SOLDERING SYSTEM AND METHOD OF USING SAME

CROSS-REFERENCE TO RELATED APPLICATIONS

Co-pending U.S. patent application, entitled "SOLDERING SYSTEM CONTROLLED POWER SUPPLY APPARATUS AND METHOD OF USING SAME", filed Feb. 23, 1990, assigned Ser. No. 07/483,680 is hereby incorporated by reference, as if fully set forth herein.

DESCRIPTION

1. Technical Field

This invention relates in general to a soldering system, and a method of using it. It more particularly relates to a system for facilitating in a more accurate manner, soldering operations, such as for integrated circuit devices.

2. Background Art

There have been many different types and kinds of mass production techniques for assembling electronic devices, such as an integrated circuit device, to a printed circuit board. One such technique is the pick and place system. In this system, the devices to be installed are transported from one location to another during the course of assembling them in the desired locations on a printed circuit board.

Such pick and place systems typically employ a robotic device for moving selectively and a pick and place head or holding unit, retrieve the devices seriatim from one location, and then position them at the desired locations on the printed circuit board, so that they may be affixed thereto by a suitable soldering technique, such as a reflow solder technique. In this regard, in such a pick and place system, an important aspect of moving the circuit devices from the pick-up station to the place station where the printed circuit board is located, is the accurate positioning of the leads of the circuit device on the pads of the printed circuit board to enable proper solder connections for electrical continuity. If the closely spaced leads of the miniature devices are not each properly aligned with the circuit board, improper solder connections can result. Thus, costly and unwanted rejects of the assembled circuit board can result.

While such prior known systems may have been satisfactory for some applications, the problems experienced in the manufacturing of printed circuit board assemblies have occurred all too frequently. In this regard, misalignment between the leads of the integrated circuit device and the pads of a printed circuit board has resulted not only in improper solder connections, but also in the formation of electrical shorts between adjacent leads and pads, when the leads are soldered to the printed circuit board pads.

One attempted solution to solve the above-mentioned problem, included the provision of a separate staging station where a television camera is used to determine the position of the device leads relative to the pick up head to determine their orientation accurately. Should a misalignment be detected, when the device is first picked up, then there is a high degree of probability that the device will subsequently be deposited in an improperly aligned manner on the circuit board. Thus, should the camera detect a misalignment between the device and the head, the robot controlling the movement of the head, makes a correction automatically in the orientation of the final positioning of the device onto the printed circuit board, based on the initial determinations made at the initial staging position.

While such a solution may be satisfactory for some larger circuit devices, it has not proven to be entirely satisfactory for the smaller integrated circuit devices. In this regard, miniature devices typically require placement accuracies of 0.001 inch or less. In moving such small size devices from the visualization staging station to the final placement station, slight vibration or jarring in the robot or other equipment, can cause small, unwanted misalignments of the initially aligned leads of the circuit device, relative to the head. Therefore, even though the device is initially picked up in a proper manner, it can become improperly misaligned during its travel to its final resting place on the printed circuit board.

Therefore, it would be highly desirable to have a more accurate technique for the pick up and final placement of devices for placement on a printed circuit board. Such a technique should be highly accurate, and it should greatly reduce, or even substantially eliminate, the misalignment of the leads of the device, relative to the pads of a printed circuit board. Moreover, such a technique should not only be highly effective, but it should also be efficient, by enabling the device to be picked up directly from a conventional lead die forming station where the devices are initially prepared, prior to their assembly to a printed circuit board. Thus, the requirement for an intermediate staging station should be eliminated, or at least rendered optional.

DISCLOSURE OF INVENTION

Therefore, the principal object of the present invention is to provide a new and improved soldering system, which enables a circuit device to be positioned more accurately on a printed circuit board.

Another object of the present invention is to enable a circuit device to be picked up directly from its lead die forming machine and moved to a printed circuit board for assembly purposes, without the requirement for an intermediate staging area for all of the devices to be stored temporarily, while waiting to be retrieved.

Briefly, the above and further objects of the present invention are realized in accordance with the present invention by providing a visualization station closely disposed relative to the final placement station at the printed circuit board, where a visualizing unit, such as a television camera, determines the positions of device leads, relative to the pick up head, so that orientation of the device can be adjusted positionally at the time of its final placement on the printed circuit board, in a more accurate manner. In this manner, any unwanted movement of the device during its transportation, as well as any initial misalignment can be detected, so that the placement operation can be adjusted accordingly.

As a result, the devices can be retrieved directly from a lead-forming die machine, and transported to the visualization station disposed in close proximity to the printed circuit board at the final placement stage.

The soldering system includes a pick up assembly, which includes a set of light emitting diodes, for illuminating the leads of the device in substantially their final placement position, so they may be clearly visualized by the television camera. Subsequently, after viewing the lead positions, the placement of the head is adjusted in the X-Y and theta Z axes, for proper and accurate alignment of the leads with the printed circuit board pads.

Employing the camera in close proximity to the final resting position on the printed circuit board, and back lighting the lead positions of the device, enables the leads to be visualized more accurately prior to placement of the device onto the printed circuit board.

In one form of the invention, the soldering head assembly also includes a plurality of thermode blades for helping to facilitate the engaging of the leads of the electronic unit with the pads of the printed circuit board and for subsequently heating the pads of the printed circuit board, to cause solder deposited thereon, to reflow. Thus, bonding of the leads of the circuit device to the pads of the printed circuit board can be achieved in a more accurate manner.

BRIEF DESCRIPTION OF DRAWINGS

The above mentioned and other objects and features of this invention and the manner of attaining them will become apparent, and the invention itself will be best understood by reference to the following description of the embodiment of the invention in conjunction with the accompanying drawings, wherein.

BEST MODE FOR CARRYING OUT THE INVENTION

Figure 1:
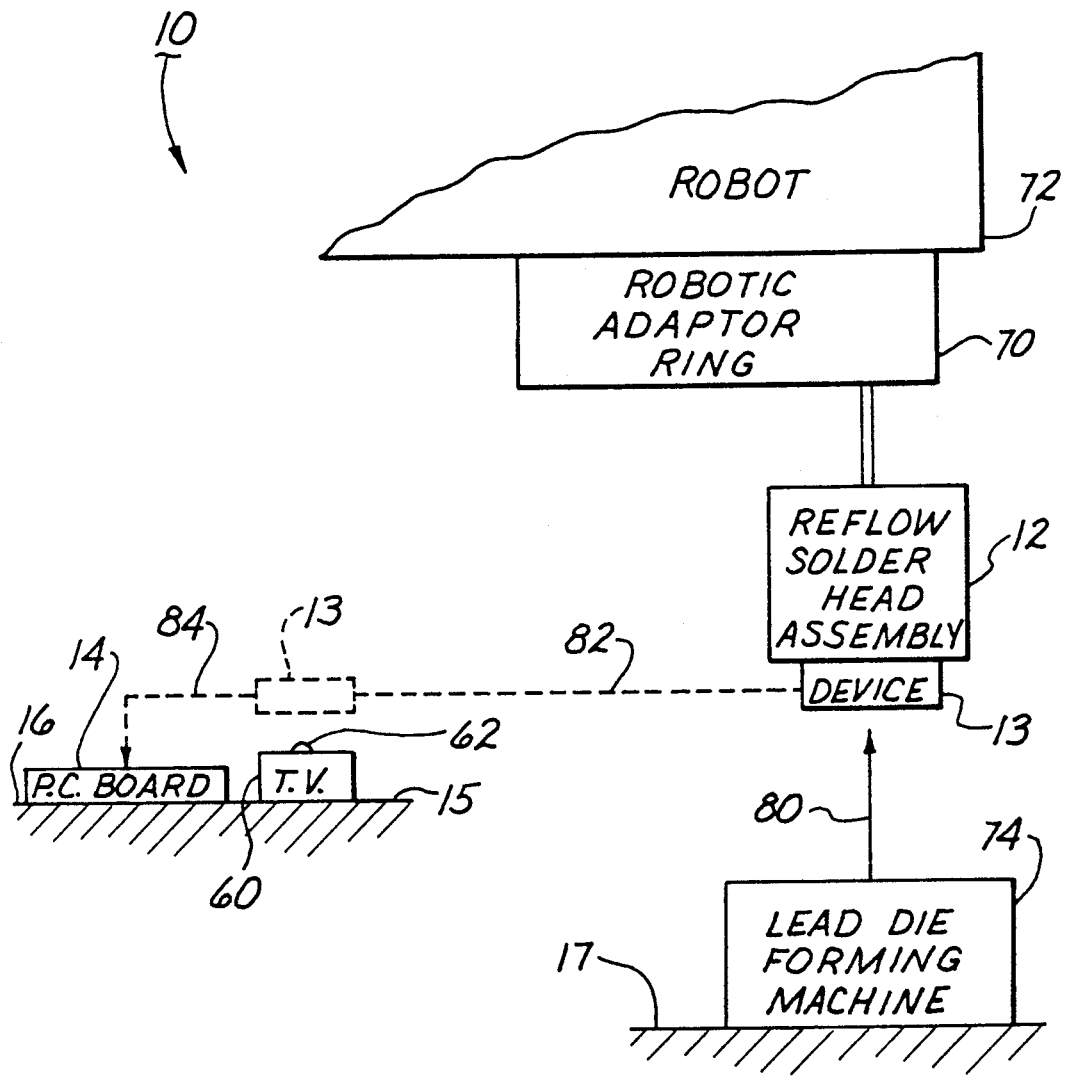
FIG. 1 is a diagrammatic view of a soldering system, including a reflow soldering head, which system and head are each constructed in accordance with the present invention.

Referring now to the drawings, and more particularly to FIG. 1, there is shown a soldering system 10 which is constructed in accordance with the present invention. The system 10 of the present invention enables a circuit device, such as an integrated circuit device 13, to be positioned more accurately on a printed circuit board, such as a printed circuit board 14, thereby increasing the quality of the assembled printed circuit board by eliminating or at least greatly reducing misalignments associated with improper placement of the circuit device on the printed circuit board. The soldering system includes a backlighted reflow soldering head assembly 12 which is constructed to fit within a common robotic adaptor ring 70 for mounting onto robots, such as a robot 72, that forms part of the soldering system 10. The soldering system 12 includes a visualization station 15 closely disposed relative to a final placement station 16 at the printed circuit board 14 where a visualizing unit, such as a television camera 60 determines the positions of leads on the device 13 relative to the reflow soldering head assembly 12, so that orientation of the device 13 can be adjusted positionally at the time of its final placement on the printed circuit board 14, in a more accurate manner. In this manner, any unwanted movement of the device during its transportation, as well as any initial misalignments, can be detected, so that the placement operation can be adjusted accordingly.

As a result, the devices, such as device 13, can be retrieved directly from a lead forming die machine, such as machine 74, at a pick up station 17 and transported to the visualization station 15 disposed in close proximity to the printed circuit board 14 at the final placement station 16.

In operation, after a device such as device 13 has been retrieved from the lead die forming machine 74 and transported to the visualization station 15, its leads positions are viewed by the camera 60. Subsequently, after viewing the leads positions, the placement of the head is adjusted in the X, Y and theta Z axes, for proper and accurate alignment of the leads with the printed circuit board pads.

Employing the camera 60 in close proximity to the final resting position of the printed circuit board for viewing purposes, and enables the leads to be visualized more accurately prior to the placement of the device 13 onto the printed circuit board 14.

While the reflow solder head assembly 12 is shown as the preferred embodiment of the present invention, it will become apparent to those skilled in the art that any pick and place assembly could be illuminated and employed with other different types and kinds of pick and place systems that do not require a soldering operation but yet still require the accurate placement of a transportable unit to a stationary mounting surface.

Figure 2:
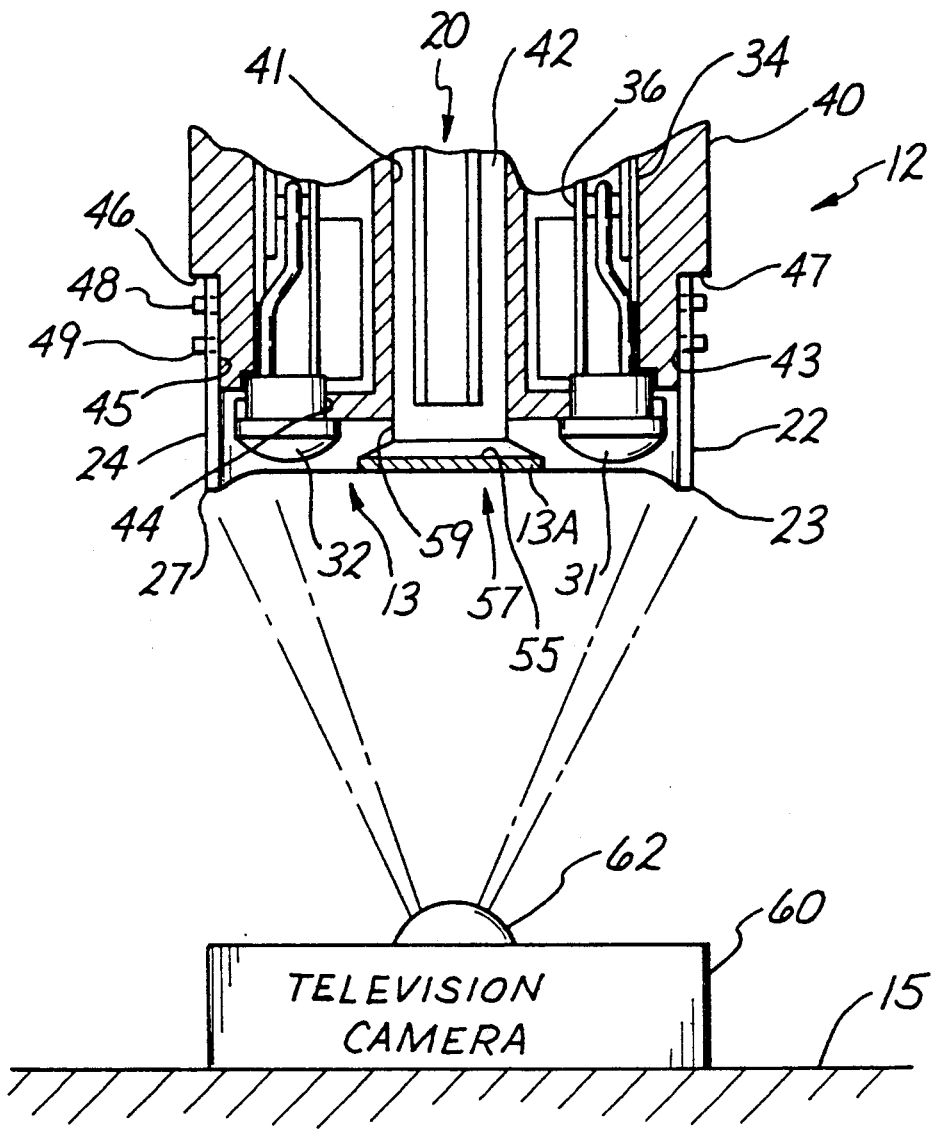
FIG. 2 is a greatly enlarged, partially diagrammatic, longitudinal sectional view of the solder head assembly of FIG. 1.

Considering now the solder head assembly 12 in greater detail with reference to FIGS. 1 and 2, the assembly 12 generally comprises a pick up assembly 20 which includes a set of light emitting diodes, such as diodes 31 and 32, for illuminating the leads of the device 13 in substantially their final placement position, so they may be clearly visualized by the television camera 60. The pick up assembly 20 holds a circuit device, such as the device 13, in a firm stationary manner for transportation from the lead die forming machine 74 to the printed circuit board 14 disposed at the final placement station 16. For the purpose of permitting the leads of the electronic device 13 to be soldered to the pads of a printed circuit board, such as printed circuit board 14, the solder head assembly 12 also includes a set of thermode blades, such as blades 22 and 24 for helping facilitate the engaging of the leads of the device 13 with the pads of the printed circuit board 14 and for subsequently heating the pads of the printed circuit board 14, to cause solder deposited thereon to reflow. Thus, bonding of the leads of the circuit device 13 to the pads of the printed circuit board 14 can be achieved in a more accurate manner. Each of the thermodes, such as thermode 22 includes a heating element (not shown) disposed therein. The heating element of the thermode is connected to a high current electrical source (not shown) to permit the conversion of electrical energy to thermal energy for causing the solder deposited on the pads of a printed circuit board, such as board 14, to reflow when a thermode blade is brought into resting contact with the pads of the board 14.

Considering now the pick up assembly 20 in greater detail with reference to FIGS. 1 and 2, the pick up assembly 20 includes a generally rectangular block shaped head 40 for supporting the thermode blades 22 and 24 in a fixed position. In this regard, the head 40 is composed of a thermally insulative and electrically insulative material for electrically insulating the head 40 from the thermodes for confining the thermal energy to the thermodes.

The head 40 includes a set of flat substantially smooth mounting surfaces, such as surfaces 43 and 45 for mounting the blades 22 and 24 to the head 40. The mounting surfaces 43 and 44 are dimensioned to permit the thermodes to be aligned with a set of pads on a typical printed circuit board, such as board 14. The head 40 also includes a set of flanges, such as flange 46 and 47, that is so disposed to permit the tip portion of the thermode blades to substantially align with outwardly extending leads of a typical integrated circuit device when the thermode blade is mounted to the mounting surface.

For the purpose of mounting the thermode blades 22 and 24 to the mounting surfaces 43 and 45 respectively, each of the mounting surfaces of the head 40 includes a pair of threaded holes (not shown) which are adapted to receive a pair of mounting screws, such as screws 48 and 49. In this regard, each of the thermodes, such as thermode 24, also includes a pair of corresponding mounting holes that are disposed thereon to coincide with the mounting holes in the head 40 and dimensioned to receive the mounting screws, such as the screws 48 and 49 for permitting the thermode 24 to be mounted to the face of the mounting surface 45. The mounting screws 48 and 49 also permit the power conductors (not shown) of the high current power source to be connected to the heating elements of the thermodes.

For the purpose of permitting the leads of an electronic device, such as device 13, to be held against the tip portions of the thermodes, such as tip portions 23 and 27, the pick up assembly 20 also includes a vacuum actuated picker 42. The picker 42 when actuated hold the electronic device, such as device 13, in precise orientation relative to the head 40 as it is moved by the robot 72 from station to station in the solder system 10. The picker 42 is centrally disposed in the undersurface of the head 40 and extends downwardly from the undersurface terminating in a lip 55 that defines an opening 57 that is in atmospheric communication with an air vacuum source (not shown). The picker 42 is generally conically-shaped having a cylindrical tube portion 59 that passes through a hole 41 that is centrally disposed in the head 40. The opening 57 is dimensioned to be slightly smaller than an integrated circuit body, such as body 13A forming part of the electronic device 13. In this regard when the vacuum source to the picker 42 is activated and the body 13A of the device comes into resting engagement against the lip 55 of the picker 42, a vacuum suction force is produced holding the body 13A to the lip 55 of the picker 42, with a portion of the distal end of the leads held against the tip portions, such as tip portion 23 and 27 of the thermodes 22 and 24 respectively.

Considering now the diodes 31 and 32 in greater detail with reference to FIGS. 1 and 2, the light emitting diodes 31 and 32 are disposed concentrically about the longitudinal center of the picker 42. The diodes 31 and 32 are arranged about the picker 42 in a concentric manner to permit the leads of an electronic device held against the lip of the picker 42 to be substantially fully illuminated. Thus, back lighting an electronic device such as device 13, and more particularly its leads relative to the thermodes of the assembly 12 permits the leads of the device 13 to be illuminated in substantially their final placement positions, so they may be clearly visualized by the television camera 60. In this regard, after viewing the lead positions the placement of the head assembly 12 is adjusted to correct any offsets in the X, Y and theta Z axes for proper and accurate alignment of the leads of the electronic device relative to their placement on the printed circuit board.

For the purpose of mounting the diodes 31 and 32 to the head 40, a set of electrical connectors, such as connector 34 and 36 are disposed within the head 40. The connectors 34 and 36 are connected to a low current voltage source (not shown). The head 40 also includes a set of openings, such as opening 44, that permit the diodes to be connected to the connectors. The openings, such as opening 44, are generally circular having a diameter that is slightly larger than the diameter of the base portion of a light emitting diode, such as diode 31 for permitting the diode 31 to be mounted partially within the opening to partially shield each of the diodes 31 from the thermal energy being radiated by the thermode, such as thermode 22.

Considering now the visualization station 15 in greater detail with reference to FIGS. 1 and 2, the visualization station 15 is disposed in close proximity to the placement station 16 so that the leads of the current device, such as device 13, can be inspected or visualized, in substantially their final position for proper placement on the printed circuit board 14. Placing the visualization station 15 in close proximity to the placement station 16 improves the overall accuracy of placing components with leads on very small centers, typically 0.010 inches or less, on pads requiring placement accuracies of 0.001 inches or less. More particularly, this technique is more accurate because the leads may be measured in a position that is substantially the same as the final position in the assembly 12 relative to the placement station 16 and the printed circuit board 14.

For the purpose of permitting a user of the system 10 to visualize and closely inspect the leads of the circuit device 13, the television camera 60 includes a close-up viewing lens 62. The close up lens 62 permits the leads of the device 13, to be visualized more accurately prior to placement of the device 13 on the printed circuit board 14. The television camera 60 is connected electrically to a television monitor (not shown) so the user may see the lead of the device 13 as disposed in the assembly 12.

In operation, the robot 72 under the control of the operator stationed at a television monitor (not shown) lowers the solder head assembly 12 along a first path of travel 80 to the lead die forming machine 74 at the pick up station 17 and aligns the solder head assembly 12 in proper orientation relative to the integrated circuit device 13 so that it may be accurately picked up in aligning relation with the thermodes, such as thermodes 22 and 24, of the soldering head assembly 12. Once the assembly 12 is aligned, the picker 42 is actuated for holding the device 13 to the thermodes. The assembly 12 is moved upwardly along the first path of travel 80 from the pick up station 17 and then traversely along a second path of travel 82 to the visualization station 15 that is disposed in close proximity to the placement station 16. After the device 13 has been transported to the visualization station 15, the light emitting diodes, such as diodes 31 and 32 are activated, illuminating the leads of the device 13. The camera 60 disposed at the visualization station 15 is oriented so that its lens 62 may view the lead positions of the device 13 as illuminated by the light emitting diodes 31 and 32. Once the position of the leads have been so determined, a controller (not shown) operating under the commands of the operator or user, calculates the proper offsets in the X, Y and theta Z axes thus permitting the operator to adjust the position of the assembly 12 so that leads of the device 13 may be accurately and precisely placed on the printed circuit board 14 for soldering purposes. Subsequently, after adjusting the position of the lead assembly 12, the device is moved along a third path of travel 84 to the printed circuit board 14 at the placement station 16. The new and improved technique thus, permits the device 13 to be picked up directly out of its lead-forming die machine 74 and held in position for suitable placement and soldering in a more accurate manner. More particularly, employing the camera 60 in close proximity to the final resting position on the printed circuit board 14, and back lighting the lead positions of the device 13 enables the leads to be visualized more accurately prior to placement of the device 13 on the printed circuit board 14, thus eliminating, or at least greatly reduces the susceptibility of damaged assemblies due to errors in alignment handling.

While particular embodiments of the present invention have been disclosed, it is to be understood that various different modifications are possible and are contemplated within the true spirit and scope of the appended claims. There is no intention, therefore, of limitations to the exact abstract or disclosure herein presented.

What is claimed is:

1. In a soldering system for facilitating proper alignment of circuit element leads with a printed circuit board, an arrangement comprising:
    visualization means for identifying the lead positions of the element relative to a pre-positioned printed circuit board;
    back light reflow soldering means for illuminating the leads of the element and for soldering them to said printed circuit board;
    said back light reflow soldering means including: (a) a mounting block; (b) holding means for supporting releasbly the body of the circuit element in a stationary spaced apart manner from said mounting block for reflow soldering purposes; (c) a plurality of thermode blade means for supplying heat to the tip portions of the leads of the circuit element for reflow soldering purposes; (d) a plurality of discrete light means for illuminating directly the leads of the circuit element for helpint the visualization of the leads to effect the proper alignment with the printed circuit board; (e) means defining a centrally disposed opening in the undersurface of said mounting block for receiving a portion of said holding means therein to permit it to depend from said opening in a centrally disposed manner to engage releasably the body of the circuit element; (f) mounting means for securing releasably to said mounting block said plurality of thermode blade means in a spaced apart manner from one another and equally spaced apart from said centrally disposed opening to help facilitate the soldering of the tip portions of the leads of the circuit element to said printed circuit board; (f) thermal protection means including a plurality of bores extending perpendicularly upwardly from the undersurface of said mounting block into said block for helping to shield said light means from thermal energy radiated by said thermode blade means; (g) each one of said bores being dimensioned to partially receive therein one of said discrete light means for heat shielding purposes; (h) each bore being disposed intermediate said mounting means and said centrally disposed opening for helping to orient the individual ones of said discrete light means in such a manner that each lead of the circuit element is substantially illuminated for visualization purposes; and (i) a plurality of conductor means, individual ones of said conductor means being disposed within individual ones of said bores for supplying electrical energy to individual ones of said light means and for securing releasably the individual ones of said light means within individual ones of said bores; and
    said visualization means disposed in relatively close proximity to said pre-positioned printed circuit board for permitting the position of the leads to be measured in a substantially final position relative to said printed circuit board.

2. An arrangement according to claim 1, wherein said visualization means includes a television camera having a close up viewing lens.

3. An arrangement according to claim 1, wherein said centrally disposed hole has a diameter that is substantially smaller than the body portion of the circuit element.

4. An arrangement according to claim 3, wherein said holding means includes pick and place means having a picker.

5. An arrangement according to claim 4, wherein said picker is vacuum actuated.

6. An arrangement according to claim 3, wherein said bores are disposed concentrically about said holding means for permitting the leads of the circuit element to be disposed substantially directly below said light means for illuminating the leads of the circuit element.

7. An arrangement according to claim 1, wherein said plurality of discrete light means includes at least two discrete light emitting diodes.

8. An arrangement according to claim 1, wherein said thermode blade means includes heating means for converting electrical energy to thermal energy to permit the leads of the circuit element to be soldered to the printed circuit board.

9. A method for soldering the leads of an electronic device to a printed circuit board, comprising:
    locating a visualization station in a pick and place system having a pick station and a place station in close proximity to said place station;
    using a pick and place device to releasably secure the electronic device for transportation purposes;
    transporting the electronic device from said pick station to said visualization station;
    engaging the tip portions of the leads of the electronic device with a set of thermode blades;
    illuminating from above a substantial portion of the leads with light;
    using camera means having a close up lens to view the leads of the electronic device;
    viewing the leads of the electronic device at said visualization station;
    adjusting the position of the leads relative to the printed circuit board to permit the leads to be substantially precisely placed on the printed circuit board;
    transporting the electronic device to the place station;
    placing the electronic device on the printed circuit board; and
    applying electric energy to said thermode blades to solder the leads of the electronic device to the printed circuit board.

10. A reflow soldering head assembly for facilitating the soldering of the leads projecting from the body of an electrical circuit element to a printed circuit board, said assembly, comprising:
    a mounting block;

holding means for supporting releasably the body of the circuit element in a stationary spaced apart manner from said mounting block for reflow soldering purposes;

a plurality of thermode blade means for supplying heat to the tip portions of the leads of the circuit element for reflow soldering purposes;

a plurality of discrete light means for illuminating directly the leads of the circuit element for helping the visualization of the leads to effect the propr alignment with the printed circuir board;

means defining a centrally disposed opening in the undersurface of said mounting block for receiving a portion of said holding means therein to permit it to depend from said opening in a centrally disposed manner to engage releasably the body of the circuit element;

mounting means for securing releasably to said mounting block said plurality of thermode blade means in a spaced apart manner from one another and equally spaced apart from said centrally disposed opening to help facilitate the soldering of the tip portions of the leads of the circuit element to said printed circuit board;

thermal protection means including a plurality of bores extending perpendicularly upwardly from the undersurface of said mounting block into said block for helping to shield said light means from thermal energy radiated by said thermode blade means;

each one of said bores being dimensioned to partially receive therein one of said discrete light means for heat shielding purposes;

each bore being disposed intermediate said moutning means and said centrally disposed opening for helping to orient the individual ones of said discrete light means in such a manner that each lead of the circuit element is substantially illuminated for visualization purposes; and a plurality of conductor means, individual ones of said conductor means being disposed within individual ones of said bores for supplying electrical energy to individual ones of said light means and for securing releasably the individual ones of said light means within individual ones of said bores.

* * * * *

UNITED STATES PATENT AND TRADEMARK OFFICE
CERTIFICATE OF CORRECTION

PATENT NO. : 5,033,665
DATED : July 23, 1991
INVENTOR(S) : Thomas Todd It is certified that error appears in the above-identified patent and that said Letters Patent is hereby corrected as shown below:

Column 7, Line 32, after "supporting", delete "releasbly" and substitute therefor --releasably--.

Column 7, Line 39, delete "helpint" and substitute therefor --helping--.

Column 9, Line 11, delete "propr" and substitute therefor --proper--.

Column 9, Line 12, after "printed", delete "circuir" and substitute therefor --circuit--.

Column 10, Line 12, delete "moutning" and substitute therefor --mounting--.

Signed and Sealed this

Seventh Day of September, 1993

*Attest:*

BRUCE LEHMAN

*Attesting Officer*   *Commissioner of Patents and Trademarks*